United States Patent [19]

Street et al.

[11] Patent Number: 5,164,809
[45] Date of Patent: Nov. 17, 1992

[54] AMORPHOUS SILICON RADIATION DETECTORS

[75] Inventors: Robert A. Street, Palo Alto; Victor Perez-Mendez, Berkeley; Selig N. Kaplan, El Cerrito, all of Calif.

[73] Assignee: The Regents of the University of Calif., Oakland, Calif.

[21] Appl. No.: 342,233

[22] Filed: Apr. 21, 1989

[51] Int. Cl.⁵ .............................. H01L 27/14
[52] U.S. Cl. ............................. 257/55; 257/16
[58] Field of Search ............ 357/30 A, 30 F, 30 H, 357/30 K, 30 Q, 2, 13, 58; 250/370.02, 370.1

[56] References Cited

U.S. PATENT DOCUMENTS

| | | | |
|---|---|---|---|
| 4,581,476 | 4/1986 | Yamazaki | 357/30 K |
| 4,600,935 | 7/1986 | Dresner | 357/2 |
| 4,698,658 | 10/1987 | Sannomiya et al. | 357/58 |
| 4,785,186 | 11/1988 | Street et al. | 357/370.01 |
| 4,855,805 | 8/1989 | Yamazaki et al. | 357/58 |
| 4,969,021 | 11/1990 | Thakoor et al. | 357/2 |
| 4,974,044 | 11/1990 | Cunningham et al. | 357/30 F |
| 5,025,297 | 6/1991 | Murakami et al. | 357/2 |

FOREIGN PATENT DOCUMENTS

| | | | |
|---|---|---|---|
| 2337817 | 2/1974 | Fed. Rep. of Germany | 357/30 F |
| 62-101088 | 5/1987 | Japan | 357/13 |

*Primary Examiner*—Andrew J. James
*Assistant Examiner*—Courtney A. Bowers
*Attorney, Agent, or Firm*—Paul R. Martin

[57] ABSTRACT

Hydrogenated amorphous silicon radiation detector devices having enhanced signal are disclosed. Specifically provided are transversely oriented electrode layers and layered detector configurations of amorphous silicon, the structure of which allow high electric fields upon application of a bias thereby beneficially resulting in a reduction in noise from contact injection and an increase in signal including avalanche multiplication and gain of the signal produced by incoming high energy radiation. These enhanced radiation sensitive devices can be used as measuring and detection means for visible light, low energy photons and high energy ionizing particles such as electrons, x-rays, alpha particles, beta particles and gamma radiation. Particular utility of the device is disclosed for precision powder crystallography and biological identification.

7 Claims, 6 Drawing Sheets

AMORPHOUS SILICON RADIATION DETECTORS

This invention was made, in part, with Government support under Contract No. DE-AC03-76SF00098 awarded by the Department of Energy. The Government has certain rights in this invention.

DESCRIPTION

1. Technical Field

The present invention relates to amorphous silicon film semiconductor radiation detectors and, more particularly, to new and improved amorphous silicon radiation detectors having enhanced radiation detection efficiency including those devices which measure the presence, position and count of high energy ionizing particles such as electrons, x-rays, alpha particles, beta particles and gamma radiation.

2. Background Art

In U.S. Pat. No. 4,785,186 there are disclosed amorphous silicon high energy ionizing particle detectors having a hydrogenated amorphous silicon (a-Si:H) thin film deposited via plasma assisted chemical vapor deposition techniques. The amorphous silicon film comprises three monolithic layers which include a layer of a first conductivity type, an intrinsic interlayer, and a layer of a second conductivity type, forming a p-i-n film which is sandwiched between metal electrodes to form the detector device. The penetration of inbound high energy ionizing particles generates the hole-electron pairs in the amorphous silicon layer and the measured output current signal resulting therefrom.

In U.S. Pat. No. 4,785,186, the detector response to radiation was shown to increase with applied electric field. Any device which allows an increased field will therefore have a larger response because of the improved collection of charge. Furthermore, at electric fields exceeding about $10^6$ V/cm, avalanche multiplication could be achieved. Such high fields are prevented in conventional a-Si:H sample structures because of excessive current injection at the contacts. Generally a field of no more than $5 \times 10^5$ V/cm can be achieved in a-Si:H devices. The present invention discloses new materials structures which are able to withstand higher electric fields without excessive contact injection. If such signal amplification could be achieved in amorphous silicon devices, then more sensitive, or smaller and thinner, amorphous silicon strip detectors could be employed in such applications as the chromatographic and electrophoretic separation of radioactively labeled biological compositions.

The amplification of the radiation generated current signals has been achieved in gas-filled and crystalline detectors by the principle of avalanche multiplication. Through this principle regions are created inside the radiation sensitive element of the detector which produce an electric field of sufficient strength so that electrons produced by the radiation signal gain enough energy between collisions with the surrounding atoms to liberate secondary electron-hole pairs in a controlled, stable process. It has been found that the electrons in amorphous silicon have mobilities a factor of 100 times or more higher than the holes and, therefore, amorphous silicon detectors are excellent mediums with which to accomplish signal amplification in high energy ionizing particle detectors. Experimentation with these detectors has resulted in detector structures which exhibit avalanche multiplication of signal without increasing noise, resulting in the creation of high fields in the detector without increases in noise breakdown.

SUMMARY OF THE INVENTION

In accordance with the present invention, enhanced hydrogenated amorphous silicon (a-Si:H) radiation detectors are provided in which high field regions are created resulting in amplification of a signal generated by impinging radiation. In one embodiment a plurality of electrodes used in conjunction with a reverse bias detector configuration are of differing surface area and are geometrically asymmetric in and about the hydrogenated amorphous silicon to cause an enhancement of the electric field. In another embodiment multilayers of hydrogenated amorphous silicon having different conductivity types are combined in a sandwich configuration between electrodes to match their respective electrical properties and achieve enhancement of a radiation generated signal. Both of these embodiments will result in the creation of electrical fields in excess of $5 \times 10^5$ V/cm., the minimum field necessary for avalanche multiplication of a signal caused by radiation impinging the hydrogenated amorphous silicon. The enhanced amorphous silicon detectors of the present invention can be used to detect and measure visible light, low energy photons and high energy ionizing particles such as electrons, x-rays, alpha particles, beta particles and gamma radiation.

BEST MODE FOR CARRYING OUT THE INVENTION

Figure 1:
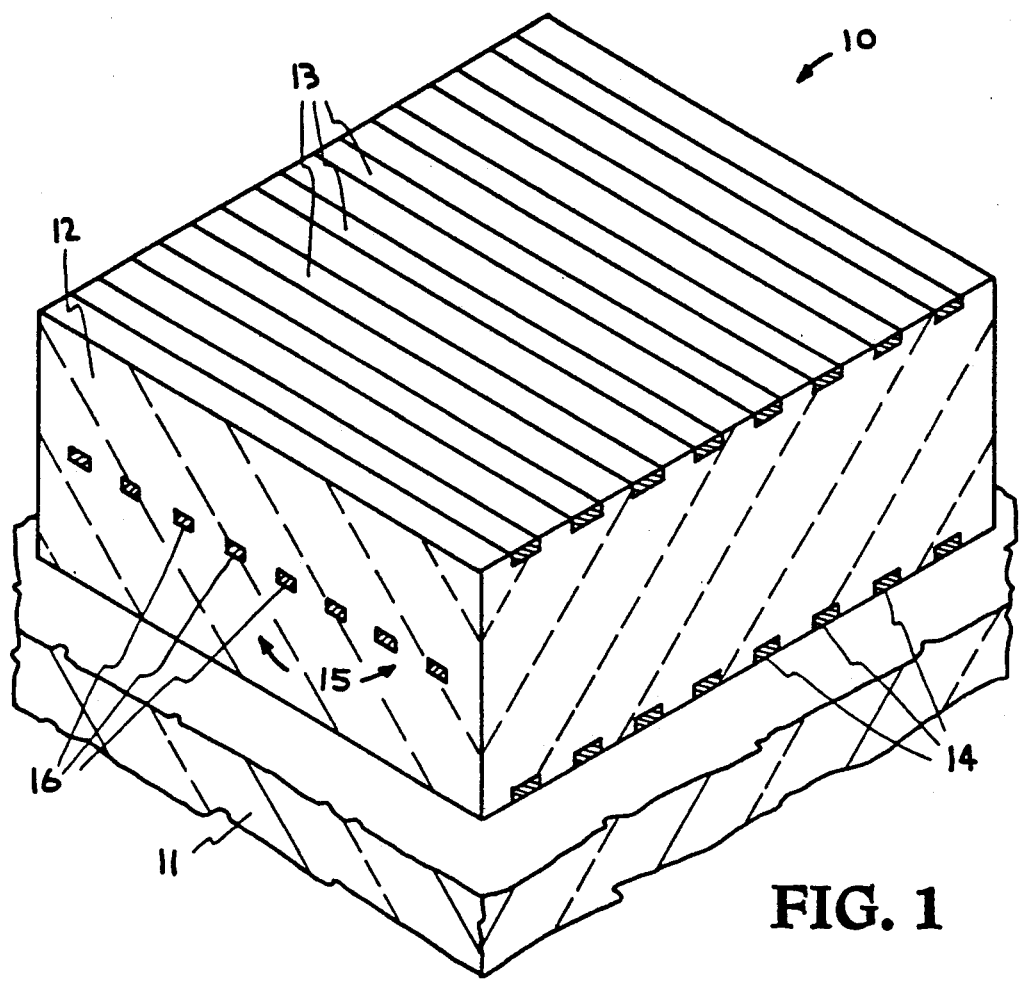
FIG. 1 illustrates a cross sectional view of one embodiment of the signal enhanced amorphous silicon detectors of this invention wherein a homojuntion of amorphous silicon in combination with geometrically asymmetric electrodes is demonstrated.

Referring to FIG. 1, a first embodiment of the present invention involving a back to back Schottky diode, an a-Si:H radiation detector 10 is shown. Detector 10 comprises a thin film 12 on a glass, plastic or metal substrate 11. A thin film or layer 12 of hydrogenated amorphous silicon ("a-Si:H") may be deposited via plasma enhanced chemical vapor deposition (PECVD) or sputtering. Substrate 11 can be of any suitable material which will withstand the high temperatures of the deposition process as, for example, 250° C. for plasma enhanced CVD. A top metal contact or electrode 13 and a bottom metal contact electrode 14 are respectively formed on the top and bottom surfaces of film 12, and an intermediate electrode is comprised of a set 15 of parallel spatially formed metal strips 16 (more aptly demonstrated in FIG. 2 as strips 16). As shown in FIGS. 1 and 2, each electrode set 13 and 14 is oriented parallel relative to one another, with the metallic strips 16 of the set 15 being aligned with one another. The intermediate set of metal contacts, internal electrode set 15, comprising parallel spatially disposed metal strips, is formed within the radiation responsive layer 12. The internal electrode strips 16 are generally of lesser width w than the width $W(>w)$ of electrode strips in the sets 13 and 14 and are oriented orthogonally to the bottom electrode set 14 and top electrode set 13 to form a multiple electrode grid arrangement indicated more clearly in the exploded view of the electrodes in FIG. 1A. The electrode sets 13, 14 and 15 may be Cr-Au, Ni, Al, Cr, Pt, Pd, Mo or Ti or any other metal that will form a suitable contact or electrode that is known in the art.

The subdivided, multiple electrode grid arrangement demonstrated in FIG. 1 readily provides a means of determining the location of a high energy particle interacting with the radiation responsive layer 12 (perspectively demonstrated). FIG. 2 is an exploded view of the grid arrangement of FIG. 1 demonstrating electrode sets 13 and 14, which are shown layered onto the outer surfaces of radiation sensitive layer 12. Top electrode set 13 comprises a set of parallel Ohmic contact strips and internal electrode set 15 is a set of parallel Ohmic contact strips 16 positioned between, and oriented perpendicular to, the top and bottom Ohmic strips of electrode sets 13 and 14, thereby forming a grid configuration in both the upper and lower layered portions of the detector 10. Provided charge-sensitive circuits 25 are connected to each and every strip, this arrangement subdivides the detector into a grid so that the signals detected at the electrodes, with appropriate processing, provides a means for determining the exact site of a high energy particle interaction, and an "image" of the incident high energy particle interactions in each layer can thus be obtained. Of course other grid arrangements other than the rectangular grid shown in FIGS. 1 and 1A could just as easily be used. Concentric annular circles and a plurality of straight strips, all of which pass through the common center of the circles, would be one such alternative arrangement.

It is to be appreciated that the grid arrangement of FIGS. 1 and 2 enables the detector to function as a position sensitive device. Alternatively, the intermediate electrode set 15 could be positioned parallel to electrode sets 13 and 14 and the detector could function as a radiation indicator device or in an orthogonally stacked arrangement to achieve greater sensitivity and position capability. As a further alternative, either top electrode set 13 or bottom electrode set 14 can be oriented parallel to internal electrode set 15 to achieve position sensitivity, the only requirement being that one external electrode set 13 or 14 be orthogonal to electrode set 15.

Figure 1A:
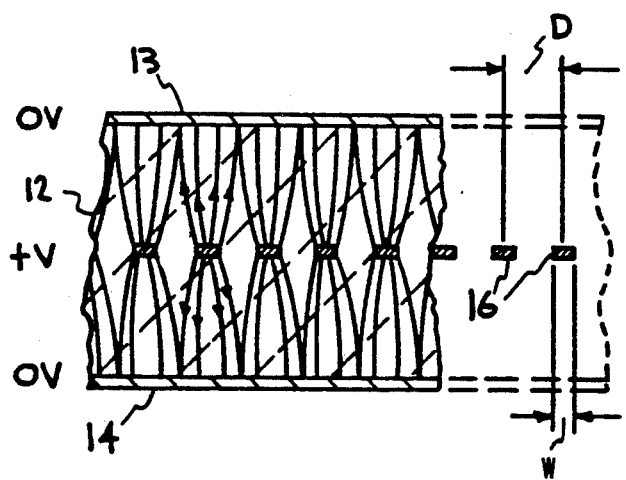
FIG. 1A is a cutaway plan view of the detector of FIG. 1 illustrating the electric field flux lines between the electrodes.
Figure 2:
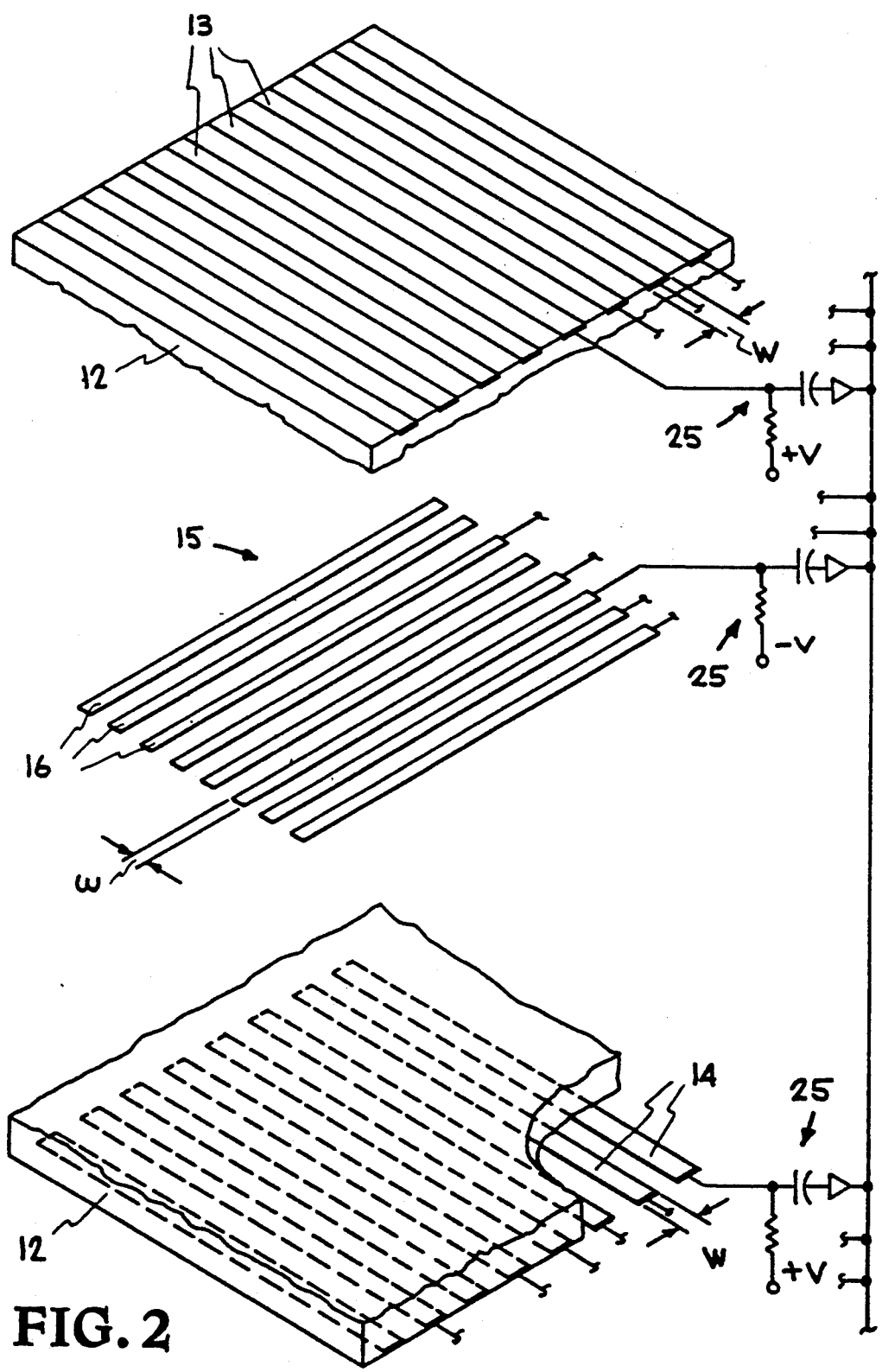
FIG. 2 is an exploded perspective view of the detector embodiment of FIG. 1 demonstrating electrical contact strips on the amorphous silicon semiconducting layers.

FIG. 1A is a further detailed perspective of FIG. 1 and demonstrates mechanistically the amplification of radiation generated signals by the detector embodiment of FIG. 1. Referring to the FIG. 1A in conjunction with FIGS. 1 and 2, an application of a positive bias to the internal electrode set 15, creates an electric field resulting in expanding lines of flux to the greater surface areas of the strips of electrodes 13 and 14. By algebraically solving fundamental electrostatic equations, it can be demonstrated that the electric field in the vicinity of a narrow positive electrode strip 16 (width w) is W/w lines larger than the field that would otherwise exist between parallel electrode strips of equal width (w=W) for the same applied potential. In this example, grounded electrode sets 13 and 14 form a single strip, where the effective width W of each strip in an electrode 13 or 14 is equal to the separation between narrow electrode strips 16 designated as D in FIG. 1A. The algebraic calculation can be accomplished by defining $E_1$ as the field on the smaller surface and $E_2$ as the field on the larger surface and using equation:

$$E_1 w = E_2 W$$

Applying a voltage of 50 Volts with a one micron separation of electrodes 13 and 15, the electric field E is equal to $5 \times 10^5$ V/cm. If the ratio W/w=10 then the field in the immediate vicinity of w is about $5 \times 10^6$ V/cm. The mathematics and general concepts exhibited here are well known in classical physics and are outlined in basic textbooks as well as being completely understood by those skilled in the art.

Figure 3:
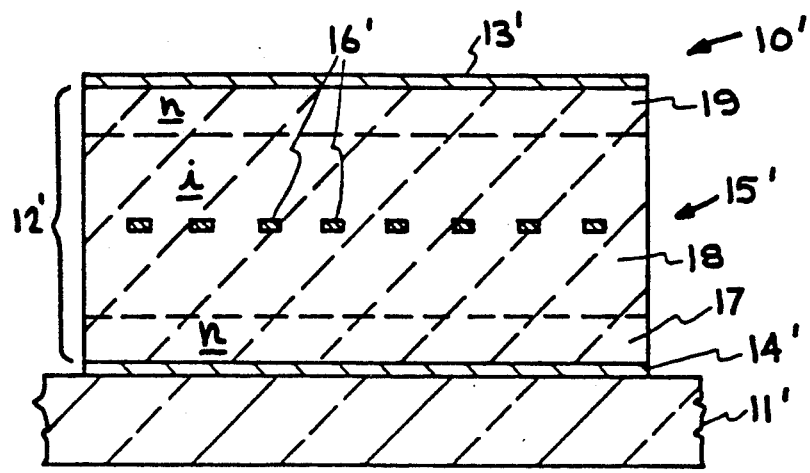
FIG. 3 is a further embodiment of FIG. 1 demonstrating a detector having an n-i-n rectifying heterojunction of amorphous silicon.

FIG. 3 is another embodiment of the geometrically asymmetric electrode structure of FIG. 1 and demonstrates a film 12' which is formed of three layers 17, 18 and 19 of amorphous silicon to form a n-i-n conductivity type detector. Inasmuch as the electrical bias has to occur between an internal electrode set 15' and external electrode sets 13' and 14' (as demonstrated in FIG. 1A), electrode strips 16' of electrode set 15' must be an N type semiconductor metal such as chromium, platinum or aluminum or, alternatively, the electrode strips could be coated with P type material which would create the necessary dual junctions between electrode set 15' and sets 13' and 14'. The n-i-n layers shown in FIG. 3 are formed as a continuous film 12', wherein the doping is modulated during growth to produce the n type layer 19 and intrinsic layer 18. Heavy elements such as germanium may be introduced in the plasma deposition process to form a Si-Ge alloy of film 12' containing up to about 20% germanium. A heavy metal amorphous silicon alloy film provides for stronger interaction of ionizing radiation to improve sensitivity of the detector, for the reason that the inbound ionizing particles will be caused to stop at shorter depths into detector 10' so that electron-hole pairs will be provided at a faster rate and will dissipate faster to zero momentum. For purposes of x-ray detection and possibly other types of ionizing radiation, the sensitivity of the film to such radiation is increased when a layer of CsI is formed on the top surface of thin film 12' prior to the deposition of electrode set 13'. When exposed to light, the layer of CsI will emit light which will pass into the detector 10' and cause a current to flow.

Figure 4:
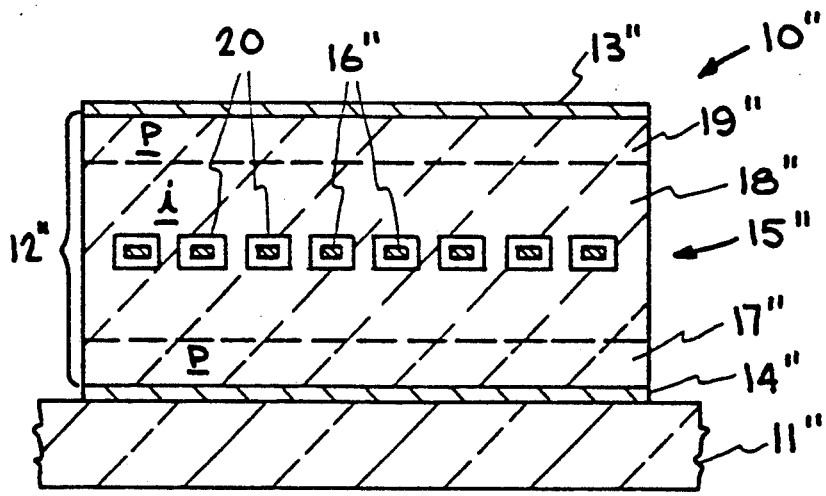
FIG. 4 is a further embodiment of FIG. 1 showing a detector having a p-i-p rectifying heterojunction of amorphous silicon.

FIG. 4 is yet another embodiment of the geometrically asymmetric electrode structure shown in FIGS. 1 and 3 and demonstrates a film layer 12" formed of a p-i-p conductivity type structure. Additionally shown in this Figure is a coating 20 of n conductivity type material on an internal electrode set 15" to create the necessary junctions between internal electrode set 15" and external electrode sets 13" and 14" and render the detector functional upon application of a reverse bias to electrode set 15". As indicated above, a similar coating of p type material could have been applied to electrode set 15' of FIG. 3 to enhance the mobility of charge carriers generated by incoming radiation.

Figure 5:
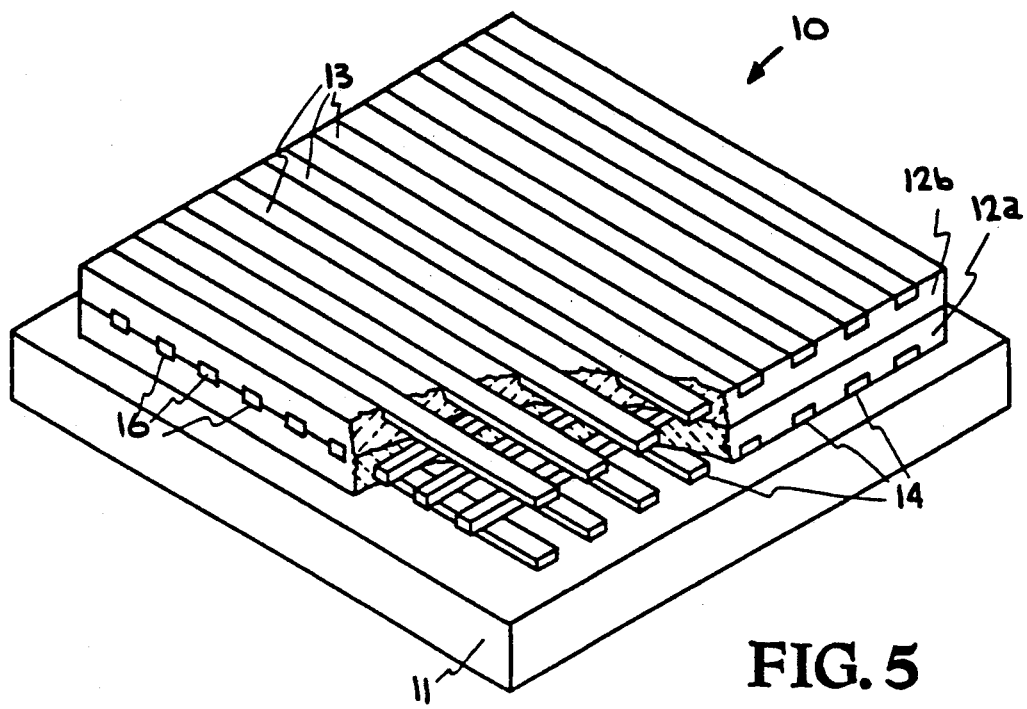
FIG. 5 is an isometric view of the detector array embodiment of FIG. 1.

FIG. 5 is a perspective view of detector array 10 comprising substrate 11 and a first set of parallel, spacially formed metal electrode strips 14 comprising the electrode set 14'. A first a-Si:H film 12a is deposited upon electrode set 14. A second set of parallel, spacially formed thin metal electrode strips 16, constituting electrode set 15 of FIG. 1, is formed on the top surface of film 12a and is oriented orthogonally to the first set of electrode strips 14. A second a-Si:H film 12b is deposited upon the second electrode set 15. This is followed by a third set of parallel, spacially formed metal strip electrodes 13, constituting top electrode set 13, being formed on the top surface of film 12b and which is oriented parallel to the first electrode set 14. As demonstrated in FIG. 2, electrode sets 13, 14 and 15 are connected in common and the external electrode sets 13 and 14 are connected as a ground or to one side or a bias supply. The internal electrode set 15 is connected to the other side of a bias supply.

The detector embodiment shown in FIGS. 1-5 is optimally operable by application of a reverse bias in which a bias is applied to electrode set 15 creating a field with both the bottom and top electrode sets 13 and 14. As shown in FIG. 2 the electrode set 15 is comprised of parallel spacially disposed metal strips of smaller width w than the width W of the orthogonally aligned strips of top and bottom electrode sets 13 and 14. Within the purview of the present invention it is only necessary that electrode set 15 be comprised of elements that are asymmetrically shaped with reference to the electrode elements of electrode sets 13 and 14. For example, electrode set 15 could consist of spacially disposed wires of significantly smaller operable surface area than that of electrode sets 13 and 14. In this way an enhanced field is created between the smaller surface areas of positively charged electrode elements 15 and negatively biased electrode elements 13 and 14. When incoming radiation generates hole-electron pairs, avalanche multiplication of the current signal will occur because of the enhanced field created between the two external sets of electrodes.

As indicated above for FIG. 1, layer 12 of amorphous silicon may be deposited via plasma enhanced CVD or sputtering. In the varying conductivity type layered configurations of FIGS. 3 and 4, doping of the n type layers is accomplished by doping with phosphorous or elements in Group V of the Periodic Table. The intrinsic layers may be made to contain a low density of defects by depositing a small amount of hydrogen in the layer. The p type layers are accomplished by doping with boron or elements in Group III of the Periodic Table. The particular devices herein disclosed have been fabricated using plasma CVD. The doping elements are sequentially introduced during the plasma decomposition of silane gas or derivatives thereof.

The thicknesses of films 12 (and their respective prime counterparts) in FIGS. 1-5 should be in the range of 1 to 50 micrometers ($\mu m$). If the film is too thin, there is not sufficient stoppage of the incident particle in the film and the sensitivity is not sufficient for good particle detection. If the film is too thick, the carriers have to propagate too far into the film. Electrode elements 13 and 14 should be thick enough to make good contact with film 12 but should not be so thick as to interfere with particle penetration into the thin film 12. For example, these external electrode strips may be from 200Å to 500Å thick. Internal electrode strips 16 may be or any thickness or diameter but preferably in the range of 2 to 20 $\mu m$.

In fabricating the electrode structures demonstrated in FIGS. 1-5, any coating or etching technique known to those skilled in the art may be employed. For example, the preparation of the n-i-n structure of FIG. 3 could be carried out by first depositing a metal substrate 11' by evaporation and employing photolithographic masking and etching techniques to produce any desired pattern of metal. Subsequently, plasma enhanced chemical vapor deposition (PECVD) techniques are employed to deposit the n layer 17 of a-Si:H. Half of the thickness of the intrinsic layer 18 is then deposited by PECVD, followed by the application of a chromium metal layer by an evaporation deposition process, thereby forming an electrode layer (ultimately to be electrode set 15). In this example, chromium chosen because it will act like a p-type semiconductor at the junction, thereby forming a Schottky barrier. Again, employing a photolithographic masking and etching technique, the electrode strips 16 are formed. The intrinsic layer 18 is then completed by further PECVD, this deposition also filling the spaces remaining between the electrodes after the etching. A further n layer 19 and metallic contact 13 are then deposited by the same method used for layer 17.

The edges of the metal electrodes must protrude through the detector, or otherwise be made accessible for electrical connections. This can be accomplished by termination in pads, or in a common bus or by any other techniques known to those skilled in the art.

Figure 6:
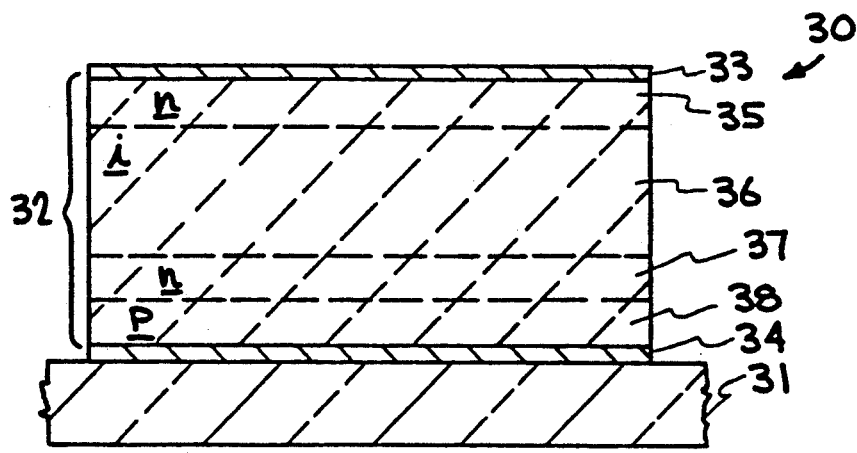
FIGS. 6, 7 and 8 are further embodiments of the invention demonstrating detectors with amorphous silicon in layered configurations of different conductivity types.
Figure 8A:
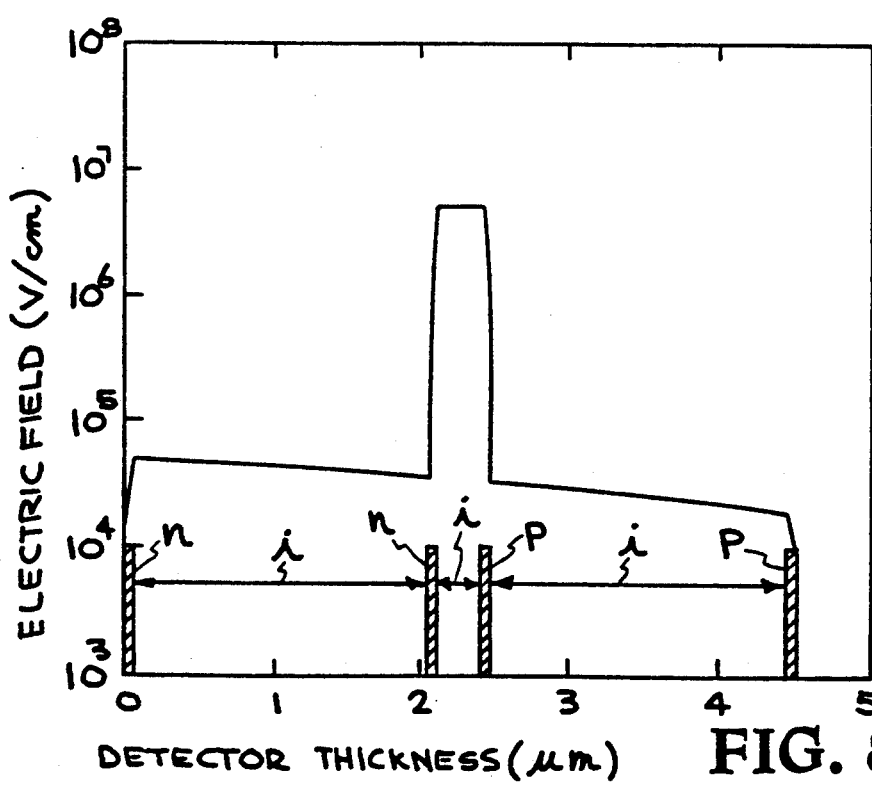
FIGS. 6A, 7A and 8A are graphic illustrations of the electric field versus detector thickness comparison of the layered configurations of FIGS. 6, 7 and 8, respectively.
Figure 7A:
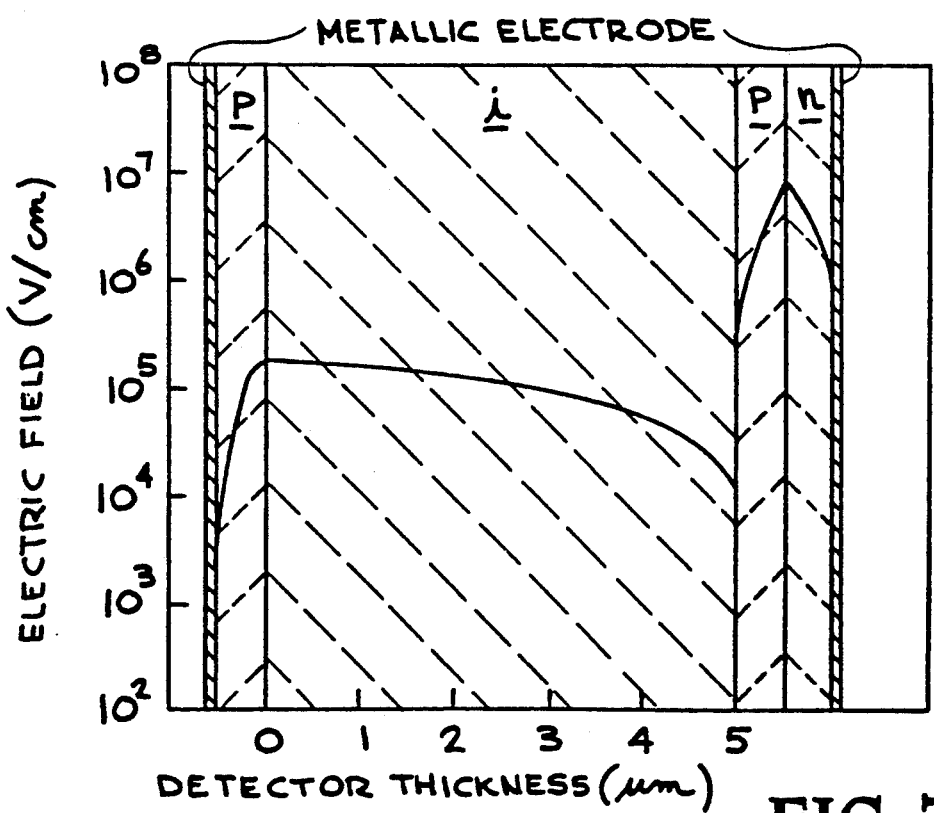
Figure 7:
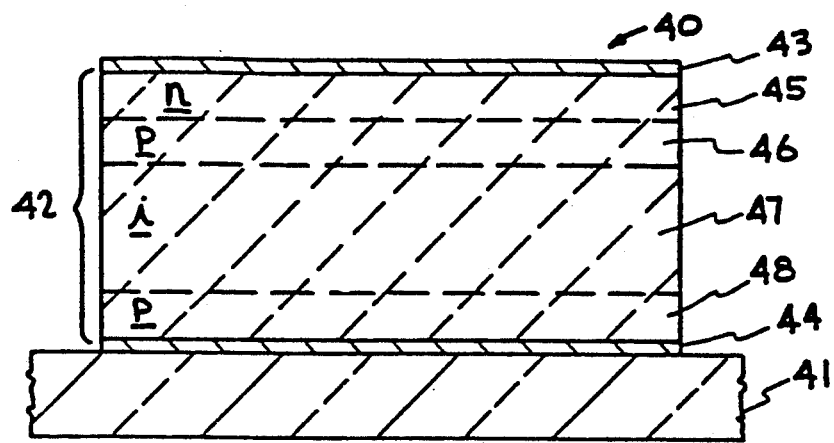
Figure 8:
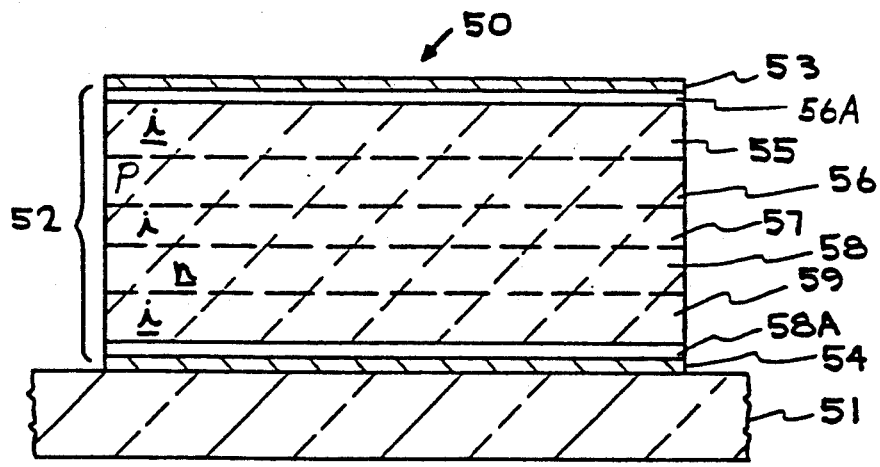

Turning to FIGS. 6, 7 and 8 three additional detector configurations are demonstrated in which increased electric field is achieved by combinations of different conductivity type a-Si:H layers in accordance with the present invention. In FIG. 6 detector 30 is a p-n-i-m amorphous silicon layer 32 sandwiched between electrodes 33 and 34. The acronym p-n-i-n refers to the order of individual monolithic layers of varying conductivity comprising radiation sensitive element 32 commencing with the layer adjacent to bottom electrode 34 on substrate 31. FIG. 7 shows a detector 40 having a PIPN structure indicating the monolithic layered configuration on bottom electrode 44 of substrate 41. FIG. 8 demonstrates a detector 50 having a n-i-n-i-p-i-p configuration, again indicating the monolithic layered configuration adjacent to bottom electrode 54. Each of these embodiments demonstrates amplification of signal generated by incident radiation because of the particular combination of layers of different conductivities. These configurations and the dimensions thereof conform to the one-dimensional Poisson equation $$d^2V/dx^2 = -\rho/\epsilon$$

The value of $\rho$ is obtained as follows: For the i region $\rho$ is the space charge and is equal to the density of ionizable dangling bond states. For these structures $\rho$ is positive for n type material when these regions are obtained by the conventional methods of doping. The thicknesses of layers are determined by a combination of R.F. power, gas pressures, substrate temperature and deposition time. The precise thickness and doping concentration will depend on the details of the required field distribution. Since it is desirable to move electrons with high velocity in avalanche regions (where the electric field is greater than $10^6$ V/cm.) the selection of concentration of p or n dopant should be greater than $10^{16}$/cm$^3$ in order that electron mobility exceed 1 cm$^2$/Volt-sec.

Figure 6A:
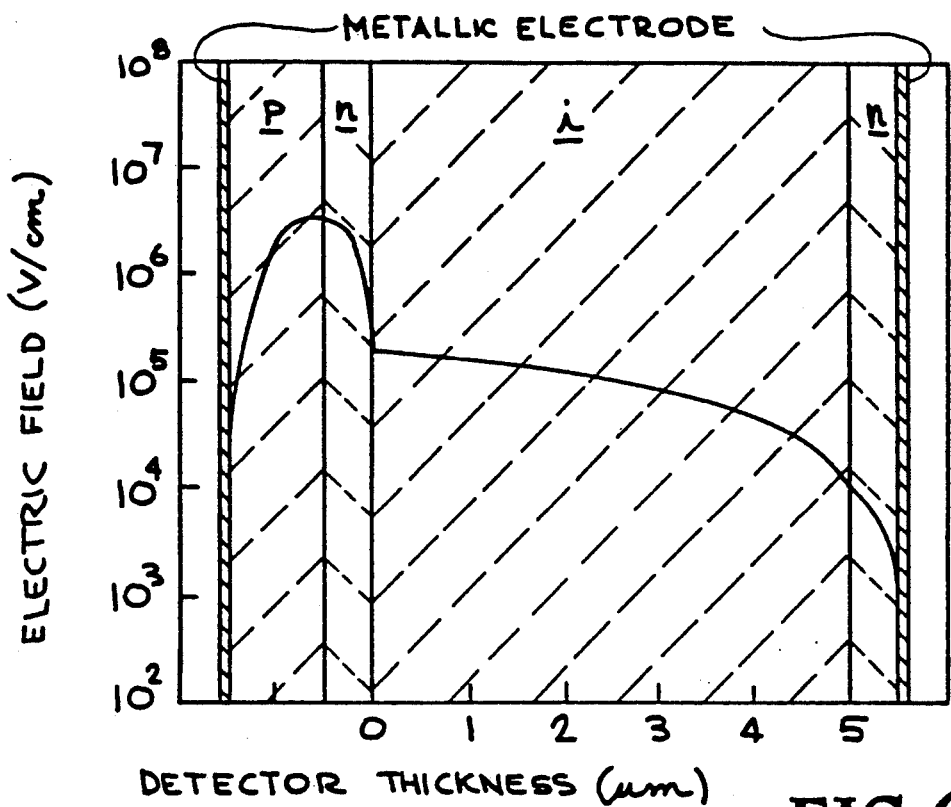

FIGS. 6A, 7A and 8A are schematics of electric-field profiles in sample structures of FIGS. 6, 7 and 8. The electric field profile can be contoured (or tailored) by adjusting the type (n or p) and concentration of dopant gas admixed with the primary gas (silane) in the deposition. The resultant density of ionizable particles will depend on this mixture, and the relationship between the applied bias voltage, the electric field, and the ionized charge density are obtained by solving the Poisson equation. Because the rate of increase of electrical field E is directly proportional to the ionized charge density, n (or p), E can be increased to a very large value in a very short distance if n (or p) is made sufficiently large by doping, and if a sufficiently high bias is applied.

It is to be understood that any of the amorphous silicon layers demonstrated in FIGS. 6, 7 and 8 can be polysilicon material and function to enhance impinging signals in accordance with the present invention. For example, any of the layers of amorphous silicon created in these Figures could be achieved by direct deposition or conversion to polysilicon by laser heat crystallization.

SPECIFIC APPLICATIONS

The following applications represent novel uses of a-Si:H signal detectors in general. While these new uses are demonstrated with the enhanced signal detectors of the present invention, it is to be understood that any a-Si:H detector may be used in the novel uses that follow.

I. Precision Powder Crystallography

Figure 9:
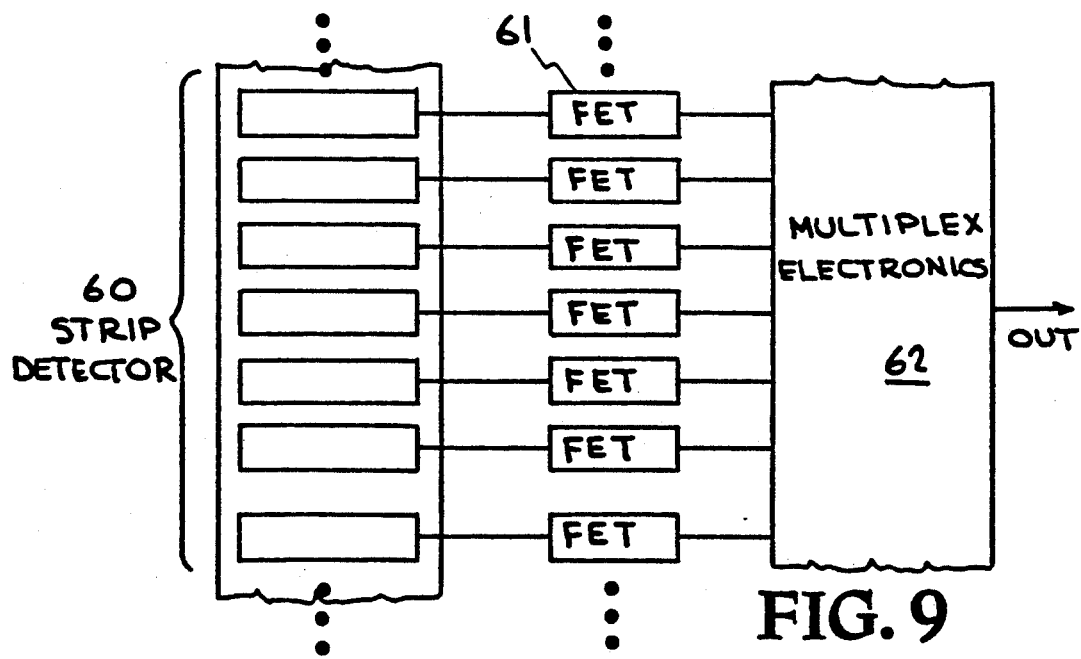
FIG. 9 is a schematic view of an application of the present invention.

The instant enhanced signal detectors may be used as very efficient, high accuracy goniometers for powder crystallography use position sensitive xenon-filled pressurized single wire detectors. In conventional powder x-ray crystallography, an anode wire is bent to an arc of a circle whose center is a powder sample. An x-ray beam is then focused through a collimator onto the powder sample and the deflected x-rays are measured about the arc by radiation sensitive means. As illustrated in FIG. 9, a strip detector 60 is an array of individual detectors each having its own output and amplifier having the a-Si:H in a PNIP layered configuration of FIG. 2. The dimensions of each detector in the array are 20 cm in length, 1 cm in width, and 30 to 50 microns in depth. The strip detector 60 is bent into a receiver arc which has a radius of about 15 cm. When the detector is subjected to a reverse bias and the deflected x-rays strike the a-Si:H radiation sensitive layer, the engendered signal produces current flow through the output circuitry 61 and a multiplex electronics device 62 reads out each event.

The energy of x-rays most often used is 8.1 keV, which is available from the Molybdenum Ka Line. Thicknesses of a-Si:H deposits should be about 30-50 microns to ensure good detection efficiency for the 8 and 17 keV lines. As indicated in Table 1, it is advantageous to add a-Ge:H to the a-Si:H to enhance the detection efficiency of the higher energy x-rays.

TABLE 1

| Xray energy | Probability of Photoelectric Effect | | | | | |
|---|---|---|---|---|---|---|
| | 100% Si | | 90% Si + 10% Ge | | 80% Si + 20% Ge | |
| | 30 μm | 50 μm | 30 μm | 50 μm | 30 μm | 50 μm |
| 8 keV | 0.37 | 0.53 | 0.45 | 0.63 | 0.53 | 0.72 |
| 17 keV | 0.051 | 0.083 | 0.18 | 0.28 | 0.31 | 0.46 |

II. Radioisotope Labeled Chromatograph/Electrophoresis

It is well known that proteins and DNA components are separated and detected by labeling them with a radionuclide such as tritium $^3$H, $^{14}$C, and $^{32}$P. The low energy of the beta of tritium makes it difficult to use gas-filled detectors since even a thin plastic window absorbs a large fraction of the tritium beta.

A strip of a-Si:H, having an avalanche configuration of p-n-i-n and a length of 10 to 20 cm and a width of 1 cm, is placed in contact with a sample of a labeled mixture of polypeptides, approximately 100 microns of the face of the detector being in contact with the sample. A reverse bias is applied across the detector strip and readings for tritium, carbon 14 and phosphorous 32 are then made by the readout.

The strip detectors used in high energy physics may be required to operate at high event rates (greater than $10^6$/sec) and hence their electronic multiplexing readout, using conventional xtal Si integrated circuits, may require use of an a-Si:H or polysilicon FET output circuitry, which are more radiation resistant than xtal Si FET. The strip detectors for x-ray crystallography generally would be required to operate at greater than $10^5$ events/sec. The biological detectors would probably have a count rate of less than $10^4$/sec. The x-ray and biological detectors should use slow, low noise a-Si:H FET electronics.

While the invention has been described in conjunction with several embodiments, it will be evident to those skilled in the art that many alternatives, modifications and variations will be apparent in light of the foregoing description. Accordingly, the invention is intended to embrace all such alternative, modifications and variations as fall within the spirit and scope of the appended claims.

We claim:
1. Apparatus for detection of incident radiation, the apparatus comprising:
   a substrate;
   an a-Si:H film, having a low particle trap density, deposited on the substrate at a first surface of the film and having a second film surface spaced apart from the first film surface;
   a first electrode, positioned at an interface between the substrate and the a-Si:H film and including a plurality of two or more electrode strips oriented approximately parallel to one another in a first direction, with each electrode strip of the first electrode having a first width $W_1$;
   a second electrode, positioned in the interior of the a-Si:H film and including a plurality of two or more electrode strips oriented approximately parallel to one another in a second direction, with each electrode strip of the second electrode having a second width $W_2$;
   a third electrode, positioned at the second surface of the a-Si:H film and including a plurality of two or more electrode strips oriented approximately parallel to one another in a third direction, where the first, second and third directions are all parallel to a common plane and at least one of the first direction and the third direction is approximately parallel to the second direction, and where at least one of the width ratios $W_2/W_1$ and $W_2/W_3$ is much smaller than 1;

voltage source means for imposing a voltage difference $V_{12}$ between the first and second electrodes and for imposing a voltage difference $V_{32}$ between the third and second electrodes; and collection means for collecting and sensing electrons and holes produced in the a-Si:H film by the incident radiation.

2. The apparatus of claim 1, wherein said a-Si:H film includes a-Ge:H in an amount up to 20 percent.

3. The apparatus of claim 1, further comprising a film of CsI positioned between said a-Si:H film and said incident radiation.

4. Apparatus for detection of incident radiation, the apparatus comprising:

a substrate;

a first electrode deposited on the substrate;

an a-Si:H film deposited on the first electrode at a first surface of the film and including an electrical field enhancement region therein that, upon application of an electrical bias, produces an electrical field of strength to an extent that a signal gain is produced by electron-hole pairs generated by the incident radiation without an excessive increase in noise, with the a-Si:H film including a plurality of at least five consecutive monolithic layers, numbered $k=1,2,3,4,5$, with layers number 1,3 and 5 being intrinsic type, with one of the layers number 2 and 4 being doped p conductivity type, and with one of the layers number 2 and 4 being doped n conductivity type;

a second electrode deposited on a second surface of the film; and bias means to impress an electrical bias between at least one of the first and second electrodes and the electrical field enhancement region.

5. Apparatus for detection of incident radiation, the apparatus comprising:

a substrate;

a first electrode deposited on the substrate;

an a-Si:H film deposited on the first electrode at a first surface of the film and including an electrical field enhancement region therein that, upon application of an electrical bias, produces an electrical field of strength to an extent that a signal gain is produced by electron-hole pairs generated by the incident radiation without an excessive increase in noise, with the a-Si:H film including a plurality of at least five consecutive monolithic layers, numbered $k=1,2,3,4,5$, with layers number 2 and 4 being intrinsic type, with the layers number 1 and 3 being doped a first electrical conductivity type, and with layer number 5 being doped a second electrical conductivity type that is opposite to the first electrical conductivity type;

a second electrode deposited on a second surface of the film; and bias means to impress an electrical bias between at least one of the first and second electrodes and the electrical field enhancement region.

6. The apparatus of claim 5, wherein the respective conductivity types of said five consecutive layers is p type, intrinsic type, p type, intrinsic type and n type.

7. The apparatus of claim 5, wherein the respective conductivity types of said five consecutive layers is p type, intrinsic type, n type, intrinsic type and n type.

* * * * *